US012666583B2

(12) United States Patent
Ling et al.

(10) Patent No.: US 12,666,583 B2
(45) Date of Patent: Jun. 23, 2026

(54) COOLING APPARATUS OF MOTOR CONTROLLER, MOTOR CONTROLLER, AND VEHICLE

(71) Applicant: BYD COMPANY LIMITED, Shenzhen (CN)

(72) Inventors: Heping Ling, Shenzhen (CN); Haijun Liu, Shenzhen (CN); Haixing Zhang, Shenzhen (CN); Xin Tan, Shenzhen (CN); Dandan Huang, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 285 days.

(21) Appl. No.: 18/611,985

(22) Filed: Mar. 21, 2024

(65) Prior Publication Data

US 2024/0237312 A1    Jul. 11, 2024

Related U.S. Application Data

(63) Continuation of application No. PCT/CN2022/134371, filed on Nov. 25, 2022.

(30) Foreign Application Priority Data

Dec. 31, 2021    (CN) ......................... 202123405296.X

(51) Int. Cl.
H05K 7/20    (2006.01)
(52) U.S. Cl.
CPC ................................ H05K 7/20927 (2013.01)
(58) Field of Classification Search
CPC ........ H05K 7/14; H10W 40/22; H10W 40/47; H10W 42/00; H10W 76/00; H02K 5/203;
(Continued)

(56) References Cited

U.S. PATENT DOCUMENTS

2007/0253164 A1*  11/2007  Matsuo .............. H05K 7/20927
                                                                      361/699
2015/0061422 A1*   3/2015  Nagao ................... H02M 7/003
                                                                      310/68 D
(Continued)

FOREIGN PATENT DOCUMENTS

CN         110758279 A      2/2020
CN         211792642 U     10/2020
(Continued)

OTHER PUBLICATIONS

International Search Report and Written Opinion for Application No. PCT/CN2022/134371, mailed on Feb. 11, 2023, 9 pages.

*Primary Examiner* — Amir A Jalali
(74) *Attorney, Agent, or Firm* — Sheppard Mullin Richter & Hampton LLP

(57) ABSTRACT

A cooling apparatus of a motor controller includes a water pipeline cover plate mounted on a motor controller body which includes a water pipeline inlet, an inlet of an inner water pipeline, an outlet of the inner water pipeline, and a water pipeline outlet. The water pipeline cover plate includes a water pipeline cover plate inlet, a power-module water inlet, a mounting groove, a power-module water outlet, and a water pipeline cover plate outlet. A heat-dissipation surface of the power module and a surface of the mounting groove surround a cooling accommodating cavity. The water pipeline inlet, the inlet of the inner water pipeline, the water pipeline cover plate inlet, and the water pipeline cover plate inlet communicate with the power-module water inlet, the cooling accommodating cavity, the power-module water outlet, and the water pipeline cover plate outlet.

20 Claims, 5 Drawing Sheets

(58) Field of Classification Search
CPC ...... H02K 9/19; H02K 9/193; H02K 11/0094;
H02K 11/33; H02K 2211/03; H02P
29/68; B60K 2001/0006
See application file for complete search history.

(56) References Cited

U.S. PATENT DOCUMENTS

| 2015/0333602 | A1* | 11/2015 | Mohr | H02K 5/203 |
| | | | | 310/68 B |
| 2016/0126802 | A1* | 5/2016 | Nagao | H02K 5/22 |
| | | | | 310/71 |
| 2016/0322279 | A1* | 11/2016 | Schmit | H10W 40/47 |
| 2021/0195810 | A1* | 6/2021 | Joshi | H02K 11/33 |
| 2022/0369513 | A1* | 11/2022 | Franz | G06F 1/206 |
| 2023/0145026 | A1* | 5/2023 | Li | H05K 7/20254 |
| | | | | 361/699 |

FOREIGN PATENT DOCUMENTS

| CN | 112677773 | A | 4/2021 |
| CN | 113015400 | A | 6/2021 |
| CN | 114554783 | A | 5/2022 |
| CN | 216982379 | U | 7/2022 |
| DE | 102005048100 | A1 | 4/2007 |
| DE | 102019200142 | A1 | 7/2020 |
| JP | 2012-146759 | A | 8/2012 |
| JP | 2018-182930 | A | 11/2018 |
| KR | 10-2020-0127750 | A | 11/2020 |

* cited by examiner

COOLING APPARATUS OF MOTOR CONTROLLER, MOTOR CONTROLLER, AND VEHICLE

CROSS-REFERENCE TO RELATED APPLICATIONS

The application is a continuation application of International Patent Application No. PCT/CN2022/134371 filed on Nov. 25, 2022, which is based on and claims priority to and benefits of Chinese Patent Application No. 202123405296.X, filed on Dec. 31, 2021. The entire content of all of the above-referenced applications is incorporated herein by reference.

FIELD

The present disclosure relates to the technical field of motor controller components, and in particular, to a cooling apparatus of a motor controller, a motor controller, and a vehicle.

BACKGROUND

In general, high-voltage control modules are integrated on a motor controller, and a heat flux density of an IGBT (Insulated Gate Bipolar Transistor) device of the motor controller is increasingly large, which has an increasingly high requirement on heat dissipation performance of the motor controller. If there are no good heat dissipation measures, temperature of the motor controller may be too high, causing performance of the motor controller to deteriorate or even damage to the motor controller.

In the related arts, to implement heat dissipation of a highly integrated motor controller system, multiple heat-dissipation channels are often required. As a result, there are a relatively large quantity of pipelines and pipeline joints inside the system, and there is an increased risk of water leakage, which is not conducive to miniaturization, integration, and high-density development of the system.

SUMMARY

The present disclosure resolves at least one of technical problems existing in a related art. Therefore, one aspect of the present disclosure is to provide a cooling apparatus of a motor controller, to resolve problems of uneven heat dissipation and complex internal pipelines of the motor controller.

A cooling apparatus of a motor controller according to the present disclosure includes: a motor controller body and a water pipeline cover plate mounted on the motor controller body. The motor controller body includes a water pipeline inlet, an inlet of an inner water pipeline inside the motor controller body, an outlet of the inner water pipeline inside the motor controller body, and a water pipeline outlet.

The water pipeline cover plate includes a water pipeline cover plate inlet, a power-module water inlet, a mounting groove, a power-module water outlet, and a water pipeline cover plate outlet.

The mounting groove is configured to mount a power module of the motor controller, and a heat-dissipation surface of the power module and a surface of the mounting groove surround a cooling accommodating cavity.

The water pipeline inlet communicates with the inlet of the inner water pipeline inside the motor controller body, the inlet of the inner water pipeline inside the motor controller body communicates with the water pipeline cover plate inlet, the water pipeline cover plate inlet communicating with the power-module water inlet, the cooling accommodating cavity, the power-module water, and the water pipeline cover plate outlet. The water pipeline cover plate outlet communicates with the outlet of the inner water pipeline inside the motor controller body, and the outlet of the inner water pipeline inside the motor controller body communicates with the water pipeline outlet.

In an embodiment, the motor controller body further includes a water pipeline inlet and a heat-dissipation water pipeline. The water pipeline cover plate outlet communicates with the second water pipeline inlet, the water pipeline inlet communicates with the heat-dissipation water pipeline, and the heat-dissipation water pipeline communicates with the outlet of the inner water pipeline inside the motor controller body.

In an embodiment, the water pipeline cover plate outlet is coupled with the second water pipeline inlet.

A pipeline between the water pipeline cover plate outlet and the second water pipeline inlet is configured to be of an arc shape.

The second water pipeline inlet includes a section connected to the heat-dissipation water pipeline at a right angle.

In an embodiment, the heat-dissipation water pipeline is of a U shape.

The second water pipeline inlet is coupled with the heat-dissipation water pipeline.

In an embodiment, a position of the water pipeline inlet is higher than a position of the inlet of the inner water pipeline inside the motor controller body.

In an embodiment, the inlet of the inner water pipeline inside the motor controller body comprises a flow guide surface.

In an embodiment, a sealing ring is disposed between the power module of and the water pipeline cover plate.

In an embodiment, the water pipeline cover plate includes multiple mounting grooves for mounting the power module, each of the mounting grooves communicates with a corresponding power-module water inlet and a corresponding power-module water outlet, and two adjacent mounting grooves communicate with each other through adjacent power-module water inlet and power-module water outlet.

In an embodiment, the water pipeline cover plate includes multiple mounting grooves for mounting the power module, and each of the mounting grooves communicates with a corresponding power-module water inlet and a corresponding power-module water outlet.

The water pipeline cover plate further includes a first branch water pipeline and a second branch water pipeline, the first branch water pipeline is connected to the water pipeline cover plate inlet, the second branch water pipeline is connected to the water pipeline cover plate outlet, the power-module water inlets of the mounting grooves are connected to the first branch water pipeline, and the power-module water outlets of the mounting grooves are connected to the second branch water pipeline.

A second aspect of the present disclosure discloses a motor controller. The motor controller according to the present disclosure includes the cooling apparatus described above.

A third aspect of the present disclosure discloses a vehicle. The vehicle according to the present disclosure includes the cooling apparatus of the motor controller described above.

Additional aspects and advantages of the present disclosure are provided in the following description, and some of the aspects and advantages become apparent from the following description or may be learned from practice of the present disclosure.

BRIEF DESCRIPTION OF THE DRAWINGS

The foregoing and/or additional aspects and advantages of the present disclosure become apparent and readily understood from the description of the embodiments made with reference to the following accompanying drawings.

DETAILED DESCRIPTION

Figure 1:
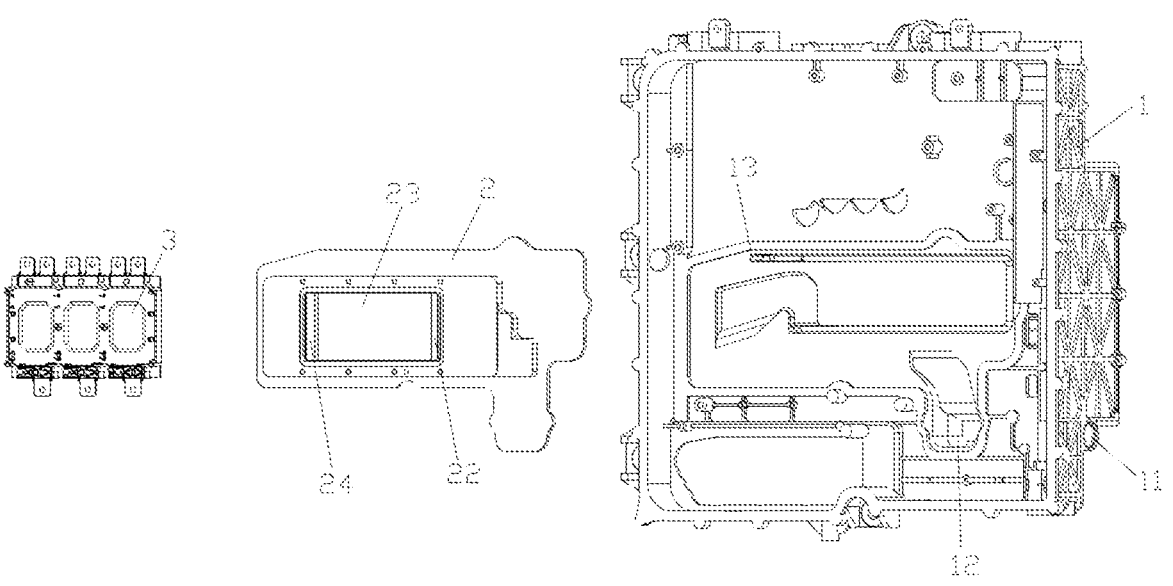
FIG. 1 is an exploded diagram of an assembly structure of a cooling apparatus of a motor controller according to an embodiment of the present disclosure.
Figure 2:
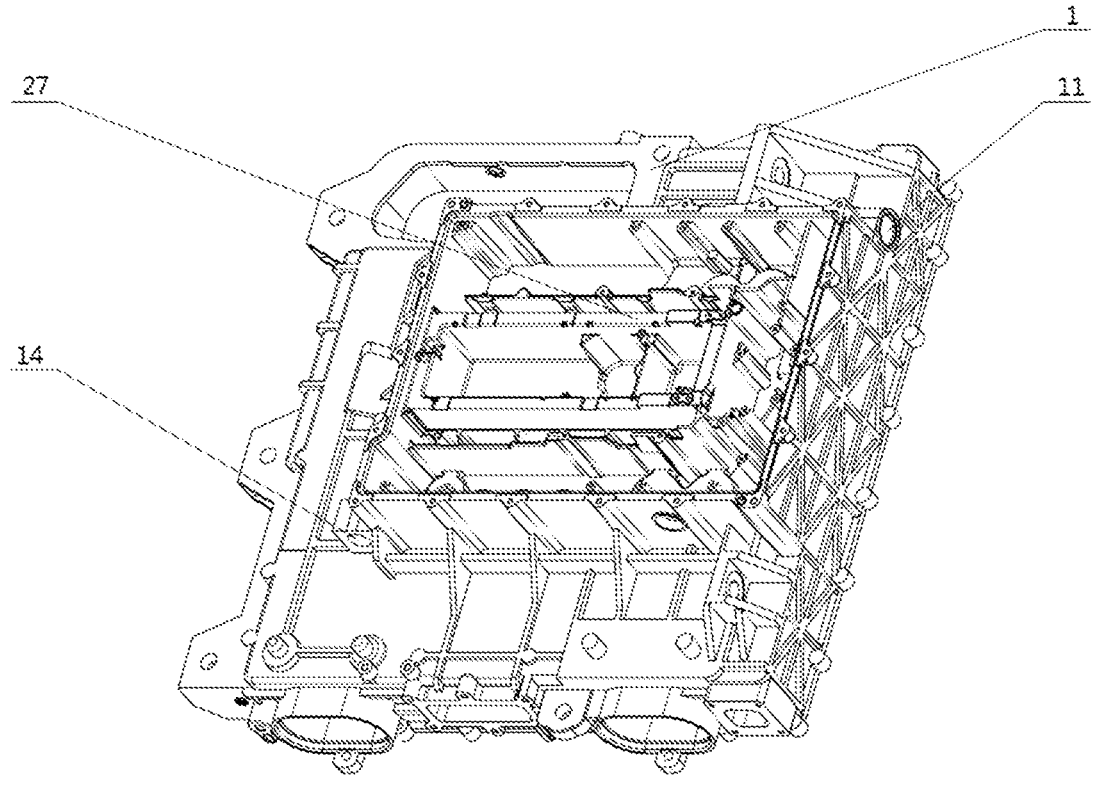
FIG. 2 is a schematic diagram of a rear structure of a motor controller body according to an embodiment of the present disclosure.
Figure 3:
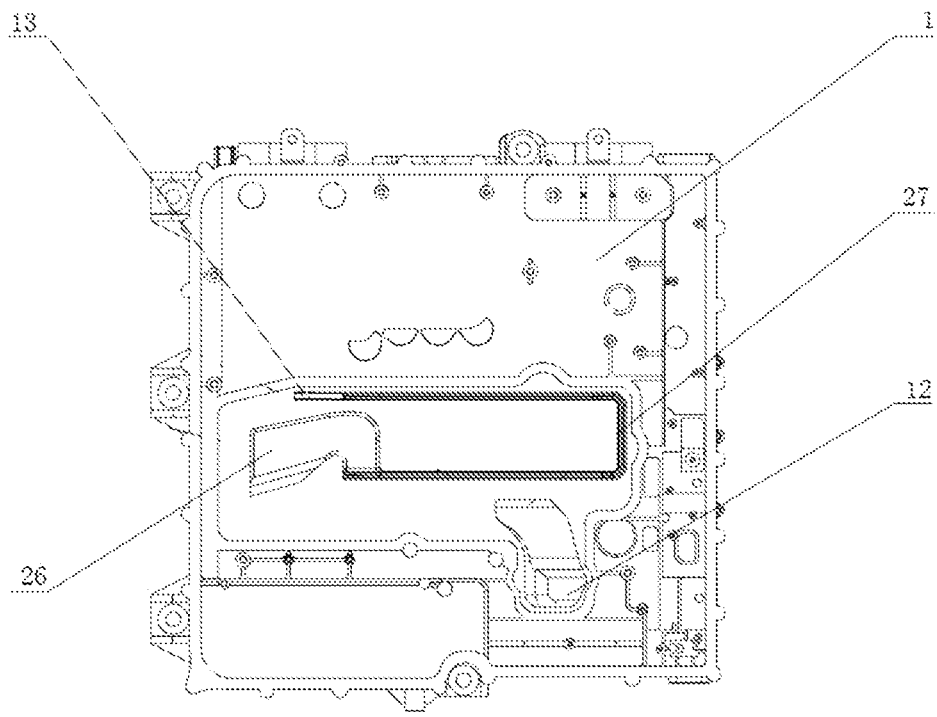
FIG. 3 is a sectional view of an internal structure of a cooling apparatus of a motor controller according to an embodiment of the present disclosure.
Figure 4:
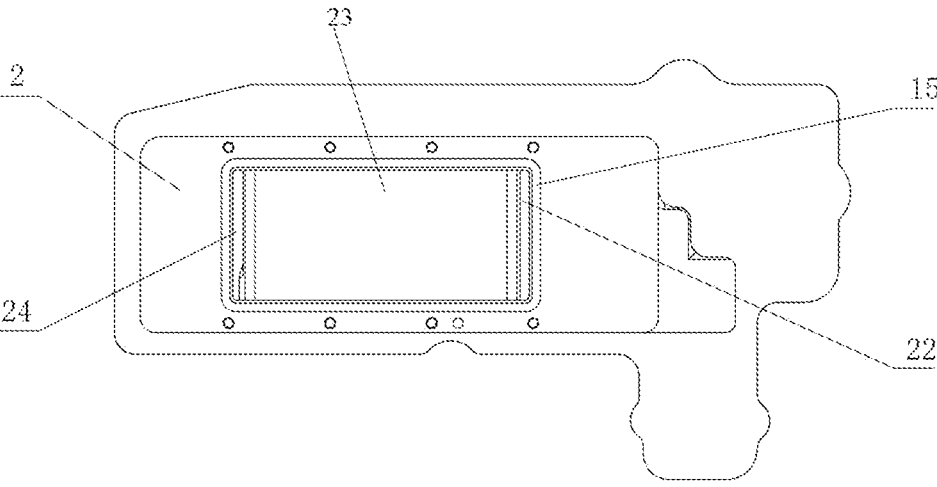
FIG. 4 is a front view of a water pipeline cover plate according to an embodiment of the present disclosure.
Figure 5:
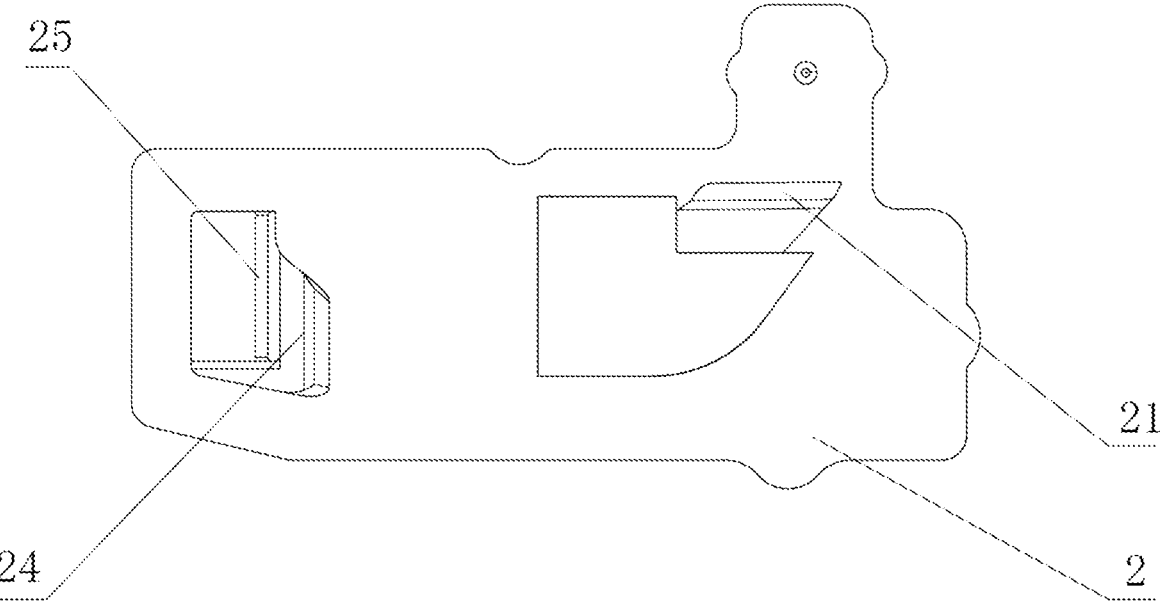
FIG. 5 is a rear view of a water pipeline cover plate of a cooling apparatus according to an embodiment of the present disclosure.
Figure 6:
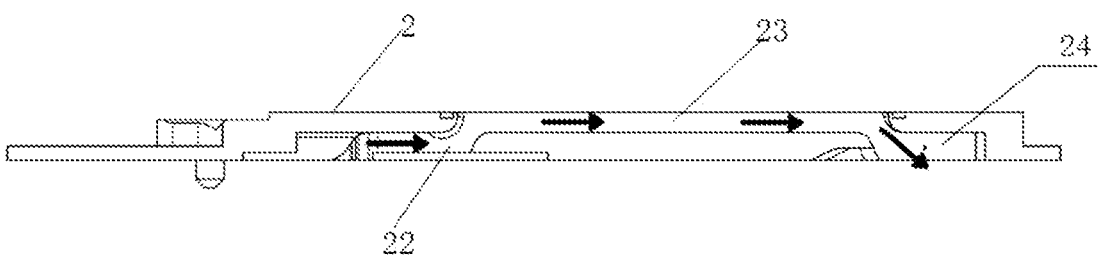
FIG. 6 is a schematic diagram of a water pipeline path of a water pipeline cover plate according to an embodiment of the present disclosure.

Embodiments of the present disclosure are described in detail below, and examples of the embodiments are shown in the accompanying drawings. Same or similar elements or elements having same or similar functions are denoted by same or similar reference numerals throughout the description. The embodiments described below with reference to the accompanying drawings are examples and used only for explaining the present disclosure, and should not be construed as a limitation on the present disclosure.

A cooling apparatus of a motor controller according to embodiments of the present disclosure is described below with reference to FIG. 1 to FIG. 9. The motor controller may be an integrated motor controller, which includes a control module and a power module of the motor controller, and integrates electrical elements such as an integrated power supply module and an OBC (on board charger) charging module.

As shown in FIG. 1 to FIG. 6, a cooling apparatus of a motor controller includes a motor controller body 1 and a water pipeline cover plate 2 mounted on the motor controller body. The motor controller body 1 is a main structure for heat dissipation and mounting of electrical elements in the motor controller, and the water pipeline cover plate 2 is fastened to and sealed with the motor controller body 1 through friction welding. The motor controller body 1 and the water pipeline cover plate 2 are welded through friction welding, so that fastening strength and a sealing degree between the water pipeline cover plate 2 and the motor controller body 1 can be ensured.

The motor controller body 1 includes a water pipeline inlet 11, a water pipeline inlet 12 inside the motor controller body (e.g., an inlet of an inner water pipeline inside the motor controller body), an outlet 13 inside the motor controller body (e.g., an outlet of the inner water pipeline inside the motor controller body), and a water pipeline outlet 14. The water pipeline inlet 11 is opened on an outer surface of the motor controller body 1 and is configured to connect to an external coolant input pipeline to input coolant. The water pipeline inlet 12 inside the motor controller body is opened on an inner surface of the motor controller body 1, and the water pipeline inlet 12 inside the motor controller body communicates with the water pipeline inlet 11. The water pipeline outlet 14 is opened on the outer surface of the motor controller body 1 and is configured to connect to an external coolant output pipeline to output coolant. The outlet 13 inside the motor controller body is opened on the inner surface of the motor controller body 1. The water pipeline outlet 14 is opened on the outer surface of the motor controller body 1, the outlet 13 inside the motor controller body is opened on the inner surface of the motor controller body 1, and the outlet 13 inside the motor controller body communicates with the water pipeline outlet 14.

The water pipeline cover plate 2 includes a water pipeline cover plate inlet 21, a power-module water inlet 22, a mounting groove 23, a power-module water outlet 24, and a water pipeline cover plate outlet 25. The water pipeline cover plate inlet 21 communicates with the power-module water inlet 22, the power-module water inlet 22 and the power-module water outlet 24 communicate with the mounting groove 23, and the water pipeline cover plate outlet 25 communicates with the power-module water outlet 24. When the water pipeline cover plate 2 is mounted on the motor controller body 1, the water pipeline cover plate inlet 21 and the water pipeline inlet 12 inside the motor controller body are matched and connected, and the water pipeline cover plate outlet 25 and the outlet 13 inside the motor controller body are matched and connected.

The mounting groove 23 is used for mounting a power module 3 of the motor controller. When the power module 3 is mounted in the mounting groove 23, a heat-dissipation surface of the power module 3 covers the mounting groove 23 of the water pipeline cover plate 2, a heat-dissipation pin on the heat-dissipation surface of the power module 3 is arranged in the mounting groove 23, and the heat-dissipation surface of the power module 3 and the mounting groove 23 of the water pipeline cover plate 2 surround a cooling accommodating cavity. The power-module water inlet 22 and the power-module water outlet 24 of the water pipeline cover plate 2 form one water flow inlet hole and one water flow outlet hole on two sides of the mounting groove 23.

When the power module 3 is mounted in the mounting groove 23, the water pipeline inlet 11 communicates with the water pipeline inlet 12 inside the motor controller body, the water pipeline inlet 12 inside the motor controller body communicates with the water pipeline cover plate inlet 21, the water pipeline cover plate inlet 21 sequentially communicates with the power-module water inlet 22, the cooling accommodating cavity, the power-module water outlet 24, and the water pipeline cover plate outlet 25, and the water pipeline cover plate outlet 25 sequentially communicates with the outlet 13 inside the motor controller body and the water pipeline outlet 14. The coolant enters the motor controller body through the water pipeline inlet 11, flows into the water pipeline cover plate inlet 21 through the water pipeline inlet 12 inside the motor controller body, and then flows into the cooling accommodating cavity through the power-module water inlet 22 to dissipate heat from the power module 3. Afterward, the coolant flows from the power-module water outlet 24 and the water pipeline cover plate outlet 25, and then flows out of the motor controller body 1 through the outlet 13 inside the motor controller body and the water pipeline outlet 14.

In the cooling apparatus according to this embodiment of the present disclosure, there is a water pipeline on both the water pipeline cover plate 2 and the motor controller body 1, and after the water pipeline cover plate 2 and the motor controller body 1 are tightly coupled and mounted, a complete cooling water pipeline is formed. The internal pipeline is simple, and the water pipeline cover plate 2 can be replaced based on different power modules 3, so that applicability is higher, thereby improving systematization and integration of the motor controller.

In an implementation, the motor controller body 1 further includes a second water pipeline inlet 26 and a heat-dissipation water pipeline 27, the water pipeline cover plate outlet 25 communicates with the second water pipeline inlet 26, the second water pipeline inlet 26 communicates with the heat-dissipation water pipeline 27, and the heat-dissipation water pipeline 27 communicates with the outlet 13 inside the motor controller body. In the motor controller body, other elements such as an integrated power supply and an OCB charging module are arranged tightly attached to the heat-dissipation water pipeline 27. The coolant enters the motor controller body through the water pipeline inlet 11, flows into the water pipeline cover plate inlet 21 through the water pipeline inlet 12 inside the motor controller body, and then flows into the cooling accommodating cavity through the power-module water inlet 22 to dissipate heat from the power module 3. Afterward, the coolant flows toward the second water pipeline inlet 26 through the power-module water outlet 24 and the water pipeline cover plate outlet 25, to enter the heat-dissipation water pipeline 27 to dissipate heat from other elements; and then flows out of the motor controller body through the outlet 13 inside the motor controller body and the water pipeline outlet 14.

In the process described above, the cooling apparatus can not only meet a heat dissipation requirement of the power module 3 of the motor controller, but also dissipate heat from other elements in the motor controller, such as an integrated power supply and an OBC charging module, so as to reduce module temperature to meet a heat dissipation requirement of a highly integrated motor controller, thereby improving reliability of the motor controller.

In an implementation, the water pipeline cover plate outlet 25 matches the second water pipeline inlet 26. When the water pipeline cover plate 2 is tightly mounted on the motor controller body, the water pipeline cover plate outlet 25 is tightly connected to the second water pipeline inlet 26, which can ensure sealing of a water pipeline and avoid dangerous situations such as short circuit of a high-voltage electrical device caused by leakage of coolant in the water pipeline. In addition, it is ensured that areas of connected cross sections of two water pipelines of the water pipeline cover plate outlet 25 and the second water pipeline inlet 26 are kept consistent, to ensure that flow resistance of the coolant flowing in the water pipeline can be minimized.

A pipeline between the water pipeline cover plate outlet 25 and the second water pipeline inlet 26 is configured of an arc shape, so as to buffer the water pipeline to reduce water resistance of the water pipeline. In addition, the second water pipeline inlet 26 is vertically connected to the heat-dissipation water pipeline 27, such that the second water pipeline inlet includes a section connected to the heat-dissipation water pipeline at a right angle. The coolant enters the heat-dissipation water pipeline 27 vertically through the second water pipeline inlet 26, so as to prevent a water flow direction in which the coolant enters the water pipeline from being parallel to a direction of the heat-dissipation water pipeline 27, thereby avoiding a situation that there is no coolant entering a lower region of the heat-dissipation water pipeline 27, resulting in uneven heat dissipation of the heat-dissipation water pipeline 27. With this structure, the coolant can enter the heat-dissipation water pipeline 27 in a water flow direction perpendicular to the heat-dissipation water pipeline 27, so that the coolant in the heat-dissipation water pipeline 27 is more even, and flow resistance can be further reduced, thereby improving heat dissipation efficiency.

The heat-dissipation water pipeline 27 is arranged of a U shape, so that the heat-dissipation water pipeline 27 has a wider range and a larger heat dissipation area in the motor controller body, thereby increasing a heat dissipation range. In addition, the heat-dissipation water pipeline 27 is a flat pipeline. An outer side of the heat-dissipation water pipeline 27 is a heat-dissipation water pipeline wall. Other electronic elements are mounted on an outer side of the heat-dissipation water pipeline wall, so that heat can be conducted to the heat-dissipation water pipeline wall and then dissipated through the heat-dissipation water pipeline 27. The flat heat-dissipation water pipeline 27 can increase a heat-dissipation contact area between an element whose heat is to be dissipated and the water pipeline.

The second water pipeline inlet 26 matches the heat-dissipation water pipeline 27 to ensure that areas of connected cross sections of the second water pipeline inlet 26 and the heat-dissipation water pipeline 27 are kept consistent, so that flow resistance of coolant flowing into the heat-dissipation water pipeline 27 through the second water pipeline inlet 26 is minimized.

In an implementation, a position of the water pipeline inlet 11 is higher than a position of the water pipeline inlet 12 inside the motor controller body, so that coolant input to the water pipeline inlet 12 inside the motor controller body through the water pipeline inlet 11 forms a falling potential difference and can have certain potential energy. In addition, the water pipeline inlet 12 inside the motor controller body is provided with a flow guide surface. In one aspect, the coolant entering the water pipeline inlet 12 inside the motor controller body can be guided to limit that a water flow direction is a direction of the water pipeline cover plate inlet 21. In another aspect, the water pipeline can be buffered to reduce flow resistance.

In an embodiment, a sealing ring is provided between the power module 3 of the motor controller and the water pipeline cover plate 2, so as to ensure that the heat-dissipation surface of the power module 3 is in close contact with the mounting groove 23 of the water pipeline cover plate 2, and ensure a sealing property of the cooling accommodating cavity to avoid leakage, thereby preventing the cooling accommodating cavity from leaking the coolant to cause dangerous situations such as short circuit of a high-voltage electrical device.

Figure 7:
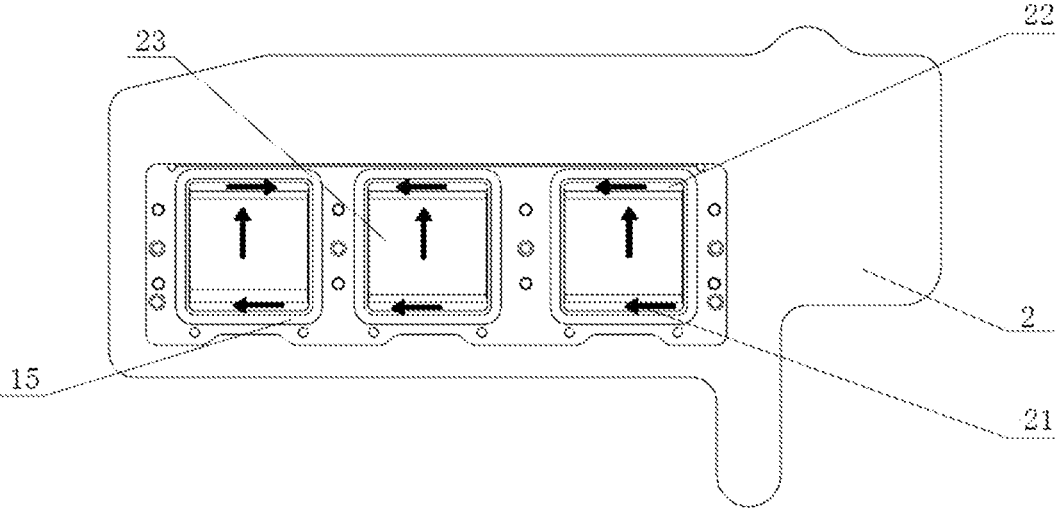
FIG. 7 is a schematic diagram of water pipeline paths of multiple power modules of a water pipeline cover plate connected in series according to an embodiment of the present disclosure.

In an implementation, as shown in FIG. 7, the motor controller may have multiple power modules 3. In this case, to better adapt to heat dissipation of the multiple power modules 3, the water pipeline cover plate 2 includes multiple mounting grooves 23 for mounting the power modules 3. Each mounting groove 23 separately communicates with the corresponding power-module water inlet 22 and power-module water outlet 24, and two adjacent mounting grooves 23 communicate with each other through the corresponding power-module water inlet 22 and power-module water outlet 24. When the multiple power modules 3 are arranged in parallel, two adjacent mounting grooves 23 communicate with each other through the corresponding power-module water inlet 22 and power-module water outlet 24, so that cooling accommodating cavities of the multiple power modules 3 arranged in parallel are connected to each other in series, to decrease a quantity of water pipelines.

The power-module water inlet 22 and the power-module water outlet 24 may be respectively connected on left and right sides of the mounting groove 23, so that the power-module water inlet 22, the mounting groove 23, and the power-module water outlet 24 are substantially in a straight line. When two adjacent mounting grooves 23 communicate with each other through the corresponding power-module water inlet 22 and power-module water outlet 24, inlets and outlets of the multiple cooling accommodating cavities connected in series are also in a straight line, which can reduce flow resistance, increase a flow speed, and make the coolant flow smoother.

Figure 8:
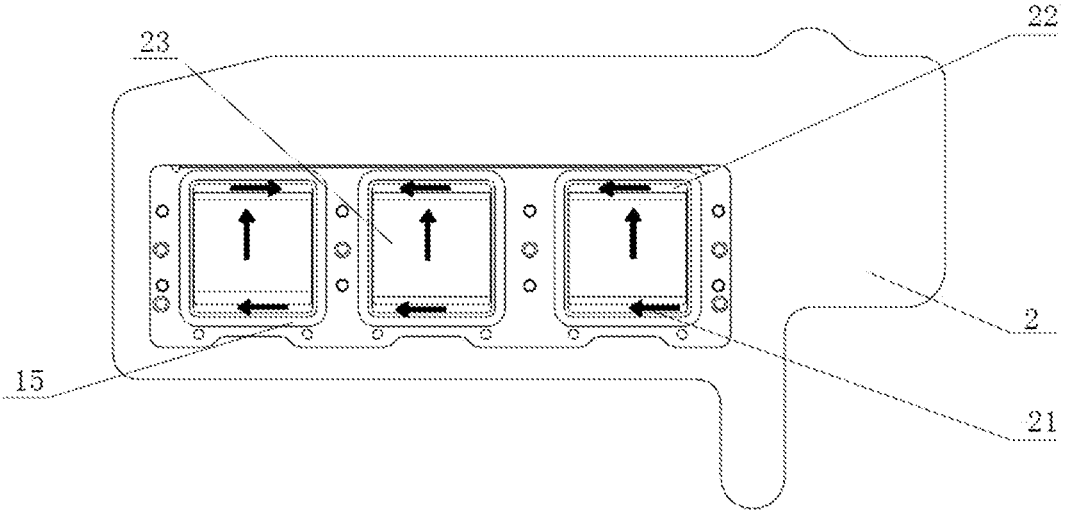
FIG. 8 is a schematic diagram of water pipeline paths of multiple power modules of a water pipeline cover plate connected in parallel according to an embodiment of the present disclosure.
Figure 9:
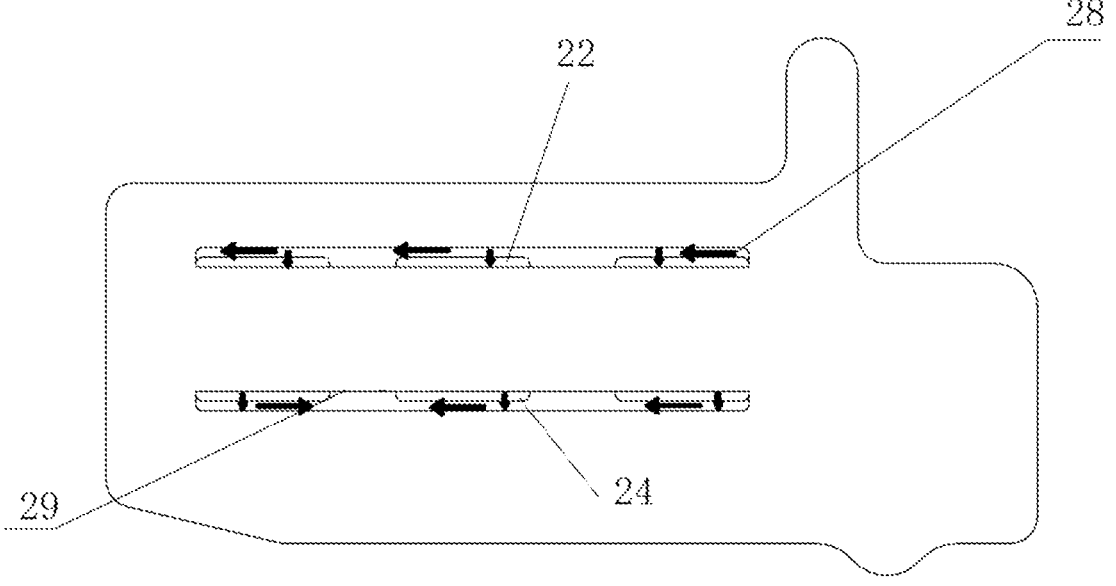
FIG. 9 is a schematic diagram of water pipeline paths of multiple power modules of a water pipeline cover plate connected in parallel according to an embodiment of the present disclosure.

In an implementation, as shown in FIG. 8 and FIG. 9, the motor controller may have multiple power modules 3. In this case, to better adapt to heat dissipation of the multiple power modules 3, the water pipeline cover plate 2 includes multiple mounting grooves 23 for mounting the power modules 3. Each mounting groove 23 separately communicates with the corresponding power-module water inlet 22 and power-module water outlet 24. The water pipeline cover plate 2 further includes a first branch water pipeline 28 and a second branch water pipeline 29. The first branch water pipeline 28 is connected to the water pipeline cover plate inlet 21, and the second branch water pipeline 29 is connected to the water pipeline cover plate outlet 25. The power-module water inlet 22 of each mounting groove 23 is connected to the first branch water pipeline 28, and the power-module water outlet 24 of each mounting groove 23 is connected to the second branch water pipeline 29.

The power-module water inlet 22 and the power-module water outlet 24 may be respectively connected on front and rear sides of the mounting groove 23. When the multiple power modules 3 are arranged/configured in parallel, the power-module water inlet 22 of each mounting groove 23 is connected to the first branch water pipeline 28, and the power-module water outlet 24 of each mounting groove 23 is connected to the second branch water pipeline 29, so that cooling accommodating cavities of the multiple power modules 3 arranged in parallel are connected to each other in parallel, and the cooling accommodating cavity of each power module 3 is on an independent water pipeline branch, which can reduce mutual influence between the power modules and improve heat dissipation efficiency.

The present disclosure further discloses a motor controller, which includes the cooling apparatus of the motor controller described above.

The present disclosure further discloses a vehicle, which includes the cooling apparatus of the motor controller described above.

The cooling apparatus of the motor controller described above is used for the vehicle according to embodiments of the present disclosure, to resolve problems of uneven heat dissipation and a complex internal pipeline of the motor controller. In addition, the heat-dissipation water pipeline is disposed in the motor controller body. Therefore, the cooling apparatus can not only meet a heat dissipation requirement of the power module of the motor controller, but also dissipate heat from other elements in the motor controller, such as an integrated power supply and an OBC charging module, so as to reduce module temperature to meet a heat dissipation requirement of a highly integrated motor controller.

In the description of this specification, the description of the reference terms "an embodiment", "some embodiments", "an example", "a specific example", "some examples", and the like means that features, structures, materials, or characteristics described in combination with the embodiment(s) or example(s) are included in at least one embodiment or example of the present disclosure. In this specification, example descriptions of the foregoing terms do not necessarily refer to the same embodiment or example. In addition, the described features, structures, materials, or characteristics may be combined in a proper manner in any one or more of the embodiments or examples.

In the description of the present disclosure, it should be understood that orientation or position relationships indicated by the terms such as "center", "longitudinal", "transverse", "length", "width", "thickness", "up", "down", "front", "rear", "left", "right", "vertical", "horizontal", "top", "bottom", "inside", "outside", "clockwise", "anti-clockwise", "axial", "radial", and "circumferential" are based on orientation or position relationships shown in the accompanying drawings, and are used only for ease and brevity of illustration and description, rather than indicating or implying that the mentioned apparatus or element needs to have a particular orientation or needs to be constructed and operated in a particular orientation. Therefore, such terms should not be construed as a limitation on the present disclosure.

In addition, terms such as "first" and "second" used in embodiments of the present disclosure are merely used for the purpose of description and cannot be understood as indicating or implying relative importance or implicitly indicating a quantity of indicated technical features in embodiments of the present disclosure. Therefore, features limited by "first" and "second" in embodiments of the present disclosure may explicitly or implicitly indicate that the embodiment includes at least one of the features. In the description of the present disclosure, unless otherwise explicitly and specifically limited in embodiments, "multiple" means "at least two" or "more than two", for example, two, three, or four.

In the present disclosure, it should be noted that unless otherwise explicitly specified or limited, the terms "mount", "connect", "connection", and "fasten" appear in embodiments should be understood in a broad sense. For example, a connection may be a fixed connection, a detachable connection, or in an integrated structure. It can be understood that the connection may be a mechanical connection, an electrical connection, or the like. Certainly, the connection may be a direct connection, an indirect connection through an intermediate medium, internal communication between two elements, or an interaction relationship between two elements. A person of ordinary skill in the art can understand meanings of the terms in the present disclosure based on an implementation situation.

In the present disclosure, unless otherwise explicitly specified and limited, that a first feature is located "above" or "below" a second feature may indicate that the first feature is in direct contact with the second feature, or that the first feature is in indirect contact with the second feature through an intermediate medium. In addition, that the first feature is "above", "over", or "on" the second feature may indicate that the first feature is directly above or obliquely above the second feature, or may merely indicate that a horizontal position of the first feature is higher than that of the second feature. That the first feature is "below", "under", and "beneath" the second feature may indicate that the first feature is directly below the second feature or obliquely below the second feature, or may merely indicate that the horizontal position of the first feature is lower than that of the second feature.

Although embodiments of the present disclosure have been shown and described, a person of ordinary skill in the art should understand that various changes, modifications, replacements, and variations may be made to the embodiments without departing from the principles and spirit of the present disclosure, and the scope of the present disclosure is defined by the appended claims and equivalents thereof.

REFERENCE NUMERALS

1: motor controller body; 2: water pipeline cover plate; 3: power module;
11: water pipeline inlet; 12: water pipeline inlet inside the motor controller body;
13: outlet inside the motor controller body; 14: water pipeline outlet; 15: sealing ring;
21: water pipeline cover plate inlet; 22: power-module water inlet; 23: mounting groove;
24: power-module water outlet; 25: water pipeline cover plate outlet;
26: second water pipeline inlet; 27: heat-dissipation water pipeline;
28: first branch water pipeline; and 29: second branch water pipeline.

What is claimed is:

1. A cooling apparatus of a motor controller, comprising:
a motor controller body and a water pipeline cover plate mounted on the motor controller body, and the motor controller body comprising a water pipeline inlet, an inlet of an inner water pipeline inside the motor controller body, an outlet of the inner water pipeline inside the motor controller body, and a water pipeline outlet;
the water pipeline cover plate comprising a water pipeline cover plate inlet, a power-module water inlet, a mounting groove, a power-module water outlet, and a water pipeline cover plate outlet;
the mounting groove being configured to mount a power module of the motor controller, and a heat-dissipation surface of the power module and a surface of the mounting groove surrounding a cooling accommodating cavity; and
the water pipeline inlet communicating with the inlet of the inner water pipeline inside the motor controller body,
the inlet of the inner water pipeline inside the motor controller body communicating with the water pipeline cover plate inlet,
the water pipeline cover plate inlet communicating with the power-module water inlet, the cooling accommodating cavity, the power-module water outlet, and the water pipeline cover plate outlet,
the water pipeline cover plate outlet communicating with the outlet of the inner water pipeline inside the motor controller body, and the outlet of the inner water pipeline inside the motor controller body communicating with the water pipeline outlet.

2. The cooling apparatus according to claim 1, wherein the motor controller body further comprises a second water pipeline inlet and a heat-dissipation water pipeline, the water pipeline cover plate outlet communicates with the second water pipeline inlet, the second water pipeline inlet communicates with the heat-dissipation water pipeline, and the heat-dissipation water pipeline communicates with the outlet of the inner water pipeline inside the motor controller body.

3. The cooling apparatus according to claim 2, wherein the water pipeline cover plate outlet is coupled with the second water pipeline inlet;
a pipeline between the water pipeline cover plate outlet and the second water pipeline inlet is configured to be of an arc shape; and
the second water pipeline inlet includes a section connected to the heat-dissipation water pipeline at a right angle.

4. The cooling apparatus according to claim 2, wherein the heat-dissipation water pipeline is of a U shape; and the second water pipeline inlet is coupled with the heat-dissipation water pipeline.

5. The cooling apparatus according to claim 1, wherein a position of the water pipeline inlet is higher than a position of the inlet of the inner water pipeline inside the motor controller body.

6. The cooling apparatus according to claim 1, wherein the inlet of the inner water pipeline inside the motor controller body comprises a flow guide surface.

7. The cooling apparatus according to claim 1, wherein a sealing ring is disposed between the power module and the water pipeline cover plate.

8. The cooling apparatus according to claim 1, wherein the water pipeline cover plate comprises a plurality of mounting grooves including the mounting groove for mounting the power module, each of the mounting grooves communicates with a corresponding power-module water inlet and a corresponding power-module water outlet, and two adjacent mounting grooves communicate with each other through adjacent power-module water inlet and power-module water outlet.

9. The cooling apparatus according to claim 1, wherein the water pipeline cover plate comprises a plurality of mounting grooves including the mounting groove for mounting the power module, and each of the mounting grooves communicates with a corresponding power-module water inlet and a corresponding power-module water outlet; and
the water pipeline cover plate further comprises a first branch water pipeline and a second branch water pipeline, the first branch water pipeline is connected to the water pipeline cover plate inlet, the second branch water pipeline is connected to the water pipeline cover plate outlet, the power-module water inlets of the mounting grooves are connected to the first branch water pipeline, and the power-module water outlets of the mounting grooves are connected to the second branch water pipeline.

10. A motor controller, comprising a cooling apparatus, the cooling apparatus comprising:
a motor controller body and a water pipeline cover plate mounted on the motor controller body, and the motor controller body comprising a water pipeline inlet, an inlet of an inner water pipeline inside the motor controller body, an outlet of the inner water pipeline inside the motor controller body, and a water pipeline outlet;

the water pipeline cover plate comprising a water pipeline cover plate inlet, a power-module water inlet, a mounting groove, a power-module water outlet, and a water pipeline cover plate outlet;

the mounting groove being configured to mount a power module of the motor controller, and a heat-dissipation surface of the power module and a surface of the mounting groove surrounding a cooling accommodating cavity; and the water pipeline inlet communicating with the inlet of the inner water pipeline inside the motor controller body, the inlet of the inner water pipeline inside the motor controller body communicating with the water pipeline cover plate inlet, the water pipeline cover plate inlet communicating with the power-module water inlet, the cooling accommodating cavity, the power-module water outlet, and the water pipeline cover plate outlet, the water pipeline cover plate outlet communicating with the outlet of the inner water pipeline inside the motor controller body, and the outlet of the inner water pipeline inside the motor controller body communicating with the water pipeline outlet.

11. The motor controller according to claim 10, wherein the motor controller body further comprises a second water pipeline inlet and a heat-dissipation water pipeline, the water pipeline cover plate outlet communicates with the second water pipeline inlet, the second water pipeline inlet communicates with the heat-dissipation water pipeline, and the heat-dissipation water pipeline communicates with the outlet of the inner water pipeline inside the motor controller body.

12. The motor controller according to claim 11, wherein the water pipeline cover plate outlet is coupled with the second water pipeline inlet;

a pipeline between the water pipeline cover plate outlet and the second water pipeline inlet is configured to be of an arc shape; and the second water pipeline inlet includes a section connected to the heat-dissipation water pipeline at a right angle.

13. The motor controller according to claim 11, wherein the heat-dissipation water pipeline is of a U shape; and the second water pipeline inlet is coupled with the heat-dissipation water pipeline.

14. The motor controller according to claim 10, wherein a position of the water pipeline inlet is higher than a position of the inlet of the inner water pipeline inside the motor controller body.

15. The motor controller according to claim 10, wherein the inlet of the inner water pipeline inside the motor controller body comprises a flow guide surface.

16. The motor controller according to claim 10, wherein a sealing ring is disposed between the power module and the water pipeline cover plate.

17. The motor controller according to claim 10, wherein the water pipeline cover plate comprises a plurality of mounting grooves including the mounting groove for mounting the power module, each of the mounting grooves communicates with a corresponding power-module water inlet and a corresponding power-module water outlet, and two adjacent mounting grooves communicate with each other through adjacent power-module water inlet and power-module water outlet.

18. The motor controller according to claim 10, wherein the water pipeline cover plate comprises a plurality of mounting grooves including the mounting groove for mounting the power module, and each of the mounting grooves communicates with a corresponding power-module water inlet and a corresponding power-module water outlet; and the water pipeline cover plate further comprises a first branch water pipeline and a second branch water pipeline, the first branch water pipeline is connected to the water pipeline cover plate inlet, the second branch water pipeline is connected to the water pipeline cover plate outlet, the power-module water inlets of the mounting grooves are connected to the first branch water pipeline, and the power-module water outlets of the mounting grooves are connected to the second branch water pipeline.

19. A vehicle, comprising a motor controller, wherein the motor controller comprises a cooling apparatus, the cooling apparatus comprising:

a motor controller body and a water pipeline cover plate mounted on the motor controller body, and the motor controller body comprising a water pipeline inlet, an inlet of an inner water pipeline inside the motor controller body, an outlet of the inner water pipeline inside the motor controller body, and a water pipeline outlet;

the water pipeline cover plate comprising a water pipeline cover plate inlet, a power-module water inlet, a mounting groove, a power-module water outlet, and a water pipeline cover plate outlet;

the mounting groove being configured to mount a power module of the motor controller, and a heat-dissipation surface of the power module and a surface of the mounting groove surrounding a cooling accommodating cavity; and the water pipeline inlet communicating with the inlet of the inner water pipeline inside the motor controller body, the inlet of the inner water pipeline inside the motor controller body communicating with the water pipeline cover plate inlet, the water pipeline cover plate inlet communicating with the power-module water inlet, the cooling accommodating cavity, the power-module water outlet, and the water pipeline cover plate outlet, the water pipeline cover plate outlet communicating with the outlet of the inner water pipeline inside the motor controller body, and the outlet of the inner water pipeline inside the motor controller body communicating with the water pipeline outlet.

20. The vehicle according to claim 19, wherein the motor controller body further comprises a second water pipeline inlet and a heat-dissipation water pipeline, the water pipeline cover plate outlet communicates with the second water pipeline inlet, the second water pipeline inlet communicates with the heat-dissipation water pipeline, and the heat-dissipation water pipeline communicates with the outlet of the inner water pipeline inside the motor controller body.

\* \* \* \* \*